(12) United States Patent
Lo

(10) Patent No.: US 8,947,878 B2
(45) Date of Patent: Feb. 3, 2015

(54) APPARATUS WITH A HANDLE HAVING A RELEASE MECHANISM

(71) Applicant: Mao-Yuan Lo, New Taipei (TW)

(72) Inventor: Mao-Yuan Lo, New Taipei (TW)

( * ) Notice: Subject to any disclaimer, the term of this patent is extended or adjusted under 35 U.S.C. 154(b) by 313 days.

(21) Appl. No.: 13/630,991

(22) Filed: Sep. 28, 2012

(65) Prior Publication Data

US 2013/0084127 A1   Apr. 4, 2013

Related U.S. Application Data

(60) Provisional application No. 61/541,097, filed on Sep. 30, 2011.

(51) Int. Cl.
  *H05K 7/20* (2006.01)
(52) U.S. Cl.
  CPC .................................. *H05K 7/20172* (2013.01)
  USPC ......................................................... 361/695
(58) Field of Classification Search
  USPC ............ 361/679.48, 695, 325–327, 728, 730, 361/740, 747; 439/366
  See application file for complete search history.

(56) References Cited

U.S. PATENT DOCUMENTS

| | | | |
|---|---|---|---|
| 4,821,146 A * | 4/1989 | Behrens et al. | 361/692 |
| 5,003,431 A * | 3/1991 | Imsdahl | 361/798 |
| 5,101,320 A * | 3/1992 | Bhargava et al. | 361/694 |
| 5,673,171 A * | 9/1997 | Varghese et al. | 361/679.34 |
| 5,751,558 A * | 5/1998 | Gullicksrud et al. | 361/801 |
| 5,757,617 A * | 5/1998 | Sherry | 361/730 |
| 5,793,614 A * | 8/1998 | Tollbom | 361/732 |
| 5,896,273 A * | 4/1999 | Varghese et al. | 361/724 |
| 6,049,449 A * | 4/2000 | Cranston et al. | 361/679.58 |
| 6,222,736 B1* | 4/2001 | Sim et al. | 361/727 |
| 6,229,708 B1* | 5/2001 | Corbin et al. | 361/728 |
| 6,282,087 B1* | 8/2001 | Gibbons et al. | 361/679.32 |
| 6,483,107 B1* | 11/2002 | Rabinovitz et al. | 250/239 |
| 6,826,056 B2* | 11/2004 | Tsuyuki et al. | 361/725 |
| 6,975,519 B2* | 12/2005 | Siahpolo et al. | 361/798 |
| 7,052,306 B2* | 5/2006 | Ishigami et al. | 439/372 |
| 7,257,886 B2* | 8/2007 | Haager et al. | 29/739 |
| 7,738,255 B2* | 6/2010 | Nishimoto et al. | 361/729 |
| 8,366,474 B2* | 2/2013 | Zhang et al. | 439/372 |
| 2007/0064385 A1* | 3/2007 | Paul et al. | 361/687 |
| 2008/0239665 A1* | 10/2008 | Franz et al. | 361/695 |
| 2009/0231804 A1* | 9/2009 | Franz et al. | 361/679.48 |
| 2011/0182026 A1* | 7/2011 | Kang | 361/679.37 |
| 2011/0267742 A1* | 11/2011 | Togami et al. | 361/679.01 |

* cited by examiner

*Primary Examiner* — Briggitte R Hammond
(74) *Attorney, Agent, or Firm* — Richard C. Vershave; Foster Pepper PLLC

(57) ABSTRACT

An apparatus with a handle having a release mechanism comprises a bracket having a front panel, an extracting module and a driven module. The extracting module is mounted on the bracket and includes a handle, an extracting piece, and a first contact portion. A spring is provided between the front panel and the extracting piece. The driven module is fixed on the bracket and includes a driven piece having a locking portion and a second contact portion. When the handle is not dragged forward, the locking portion is located in a locked position. When handle is dragged forward so that the extracting piece moves towards the front panel and that the first contact portion pushes the second contact portion, the locking portion is moved to an unlocked position. A system containing an apparatus having a handle is also provided.

30 Claims, 11 Drawing Sheets

APPARATUS WITH A HANDLE HAVING A RELEASE MECHANISM

PRIORITY CLAIM

This application claims the benefit of the filing date of U.S. Patent Application No. 61/541,097, filed Sep. 30, 2011, entitled "APPARATUS WITH A HANDLE HAVING A RELEASE MECHANISM," and the contents of which are hereby incorporated by reference in their entirety.

FIELD OF THE INVENTION

The present invention relates to an apparatus with a handle, and more particularly, to an apparatus with a handle having a release mechanism.

BACKGROUND OF THE INVENTION

Please refer to FIG. 1. FIG. 1 is a schematic diagram illustrating a conventional manner for inserting or removing an apparatus. As shown in FIG. 1, a fan module 20 is fixed within an enclosure 10 by screws 30. However, when the fan module 20 malfunctioned, it is necessary to remove the screws 30 out of the fan module 20 so as to detach the fan module 20 from the enclosure 10; by the same token, after repairing the fan module 20, the screws 30 are still needed to be used for fastening the fan module 20 within the enclosure 10. Each fan module 30 is fixed within the enclosure 10 through two screws as shown in FIG. 1, it takes 4 times to loose/fasten the two screws 30 for removing/inserting the fan module 30 out from/back into the enclosure 10 when the fan module 30 needs to be repaired. Therefore, this method is inconvenient and inefficient. Moreover, in general, the screws are small in size and can be easily lost. Accordingly, the present invention provides an apparatus with handle having a release mechanism to improve these problems mentioned above.

SUMMARY OF THE INVENTION

An aspect of the present invention is to provide an apparatus with handle having a release mechanism. The apparatus comprising: a bracket having a front panel; an extracting module mounted on the bracket and comprising: an extracting piece having a first contact portion; a handle having a holding portion and at least one elongated portion, in which the holding portion is located in an outer side of the front panel, and the at least one elongated portion conjoins with the extracting piece; and a spring placed between the front panel and the extracting piece; and a driven module mounted on the bracket and having a driven piece, the driven piece including: a retaining portion fixed on the bracket; a locking portion; and a second contact portion; wherein when the apparatus is under a first condition, and the handle is not drawn forward, the locking portion of the driven piece is in a locked position, and when the handle is drawn forward so as to make the extracting piece move toward the front panel, and the first contact portion of the extracting piece drives the second contact portion of the driven piece, the apparatus is under a third condition, and the locking portion of the driven piece is moved to an unlocked position.

According to an embodiment of the present invention, wherein the bracket has a side wall including a passage hole, and when the apparatus is under the first condition, the locking portion of the driven piece stretches out of the passage hole.

According to an embodiment of the present invention, wherein the handle has two elongated portions which extend from the end of the holding portion respectively.

According to an embodiment of the present invention, wherein the spring is placed on the elongated portion of the handle.

According to an embodiment of the present invention, wherein the elongated portion penetrates through a handle hole of the front panel.

According to an embodiment of the present invention, wherein the extracting piece has a hole, into which at least part of the second contact portion of the driven piece insert.

According to an embodiment of the present invention, wherein the driven piece is elastic and generates deformation to make the locking portion of the driven piece move to the unlocked position, when the first contact portion of the extracting piece drives the second contact portion of the driven piece.

According to an embodiment of the present invention, wherein when the apparatus is under the first condition, and the handle is not drawn forward, the first contact portion of the extracting piece does not abut against the second contact portion of the driven piece, and when the handle is drawn forward to make the extracting piece move toward the front panel, the apparatus is under a second condition where the first contact portion of the extracting piece abuts against the second contact portion of the driven piece, but the locking portion of the driven piece is still in the locked position.

According to an embodiment of the present invention, wherein the handle is a U-shaped handle.

According to an embodiment of the present invention, wherein majority of the elongated portion of the handle is located within the front panel when there is no any force applied thereon.

According to an embodiment of the present invention, wherein the first contact portion and the second contact portion have at least one inclined plane, and the orientation of the inclined plane is not perpendicular to the moving direction of the handle.

According to an embodiment of the present invention, wherein the locking portion has a leading edge which is perpendicular to the moving direction of the handle.

According to an embodiment of the present invention, wherein the locking portion has a trailing edge which is not perpendicular to the moving direction of the handle.

According to an embodiment of the present invention, wherein the retaining portion of the driven piece is riveted onto the bracket through a rivet.

According to an embodiment of the present invention, wherein the bracket has a side wall including a passage hole, and when the apparatus is under the third condition, majority of the locking portion of the driven piece returns back into the passage hole. According to an embodiment of the present invention, wherein the apparatus is a fan module.

According to an embodiment of the present invention, wherein the apparatus is one of a power supply module, a battery module, and a memory module.

Another aspect of the present invention is to provide a system comprising an apparatus with a handle. The system comprises: an enclosure; an apparatus detachably disposed within the enclosure and comprising a bracket, an extracting module, and a driven module; the extracting module placed on the bracket and comprising: an extracting piece having a first contact portion; a handle conjoined with the extracting piece; and a spring placed between a front panel of the bracket and the extracting piece; and the driven module secured on the bracket and having a driven piece, the driven piece including a locking portion and a second contact portion; wherein when the apparatus is under a first condition, and the handle is not drawn forward, the locking portion of the driven piece is in a locked position, so that the apparatus is not drawn from the enclosure, and when the handle is drawn forward so as to make the extracting piece move toward the front panel, and the first contact portion of the extracting piece drives the second contact portion of the driven piece, the apparatus is under a third condition, and the locking portion of the driven piece is moved to an unlocked position, so that the apparatus is drawn from the enclosure.

According to an embodiment of the present invention, wherein the bracket has a side wall including a passage hole, and when the apparatus is under the first condition, the locking portion of the driven piece stretches out of the passage hole, reaches into a locking hole of the system and is located in the locked position, so that the apparatus is not drawn from the enclosure.

According to an embodiment of the present invention, wherein the handle has two elongated portions which extend from the end of the holding portion respectively, and the spring is placed on the elongated portion of the handle.

According to an embodiment of the present invention, wherein the elongated portion of the handle penetrates through the front panel.

According to an embodiment of the present invention, wherein the driven piece has a retaining portion used to fix the driven piece on the bracket.

According to an embodiment of the present invention, wherein the driven piece is elastic and generates deformation to make the locking portion of the driven piece move to the unlocked position and causes the apparatus to be drawn from the enclosure, when the first contact portion of the extracting piece drives the second contact portion of the driven piece.

According to an embodiment of the present invention, wherein when the apparatus is under the first condition, and the handle is not drawn forward, the first contact portion of the extracting piece does not abut against the second contact portion of the driven piece, and when the handle is drawn forward to make the extracting piece move toward the front panel, the apparatus is under a second condition where the first contact portion of the extracting piece abuts against the second contact portion of the driven piece, but the locking portion of the driven piece is still in the locked position.

According to an embodiment of the present invention, wherein the first contact portion and the second contact portion have at least one inclined plane, and the orientation of the inclined plane is not perpendicular to the moving direction of the handle.

According to an embodiment of the present invention, wherein the locking portion has a leading edge which is perpendicular to the moving direction of the handle.

According to an embodiment of the present invention, wherein the locking portion has a trailing edge which is not perpendicular to the moving direction of the handle.

According to an embodiment of the present invention, wherein the bracket has a side wall including a passage hole, and when the apparatus is under the third condition, majority of the locking portion of the driven piece returns back into the passage hole to be moved to the unlocked position, so that the apparatus is drawn from the enclosure.

According to an embodiment of the present invention, wherein the apparatus is a fan module.

According to an embodiment of the present invention, wherein the apparatus is one of a power supply module, a battery module, and a memory module.

Many other advantages and features of the present invention will be further understood by the detailed description and the accompanying sheet of drawings.

BRIEF DESCRIPTION OF THE DRAWINGS

To facilitate understanding, identical reference numerals have been used, where it is possible to designate identical elements that are common to the figures.

DETAILED DESCRIPTION

Figure 1:
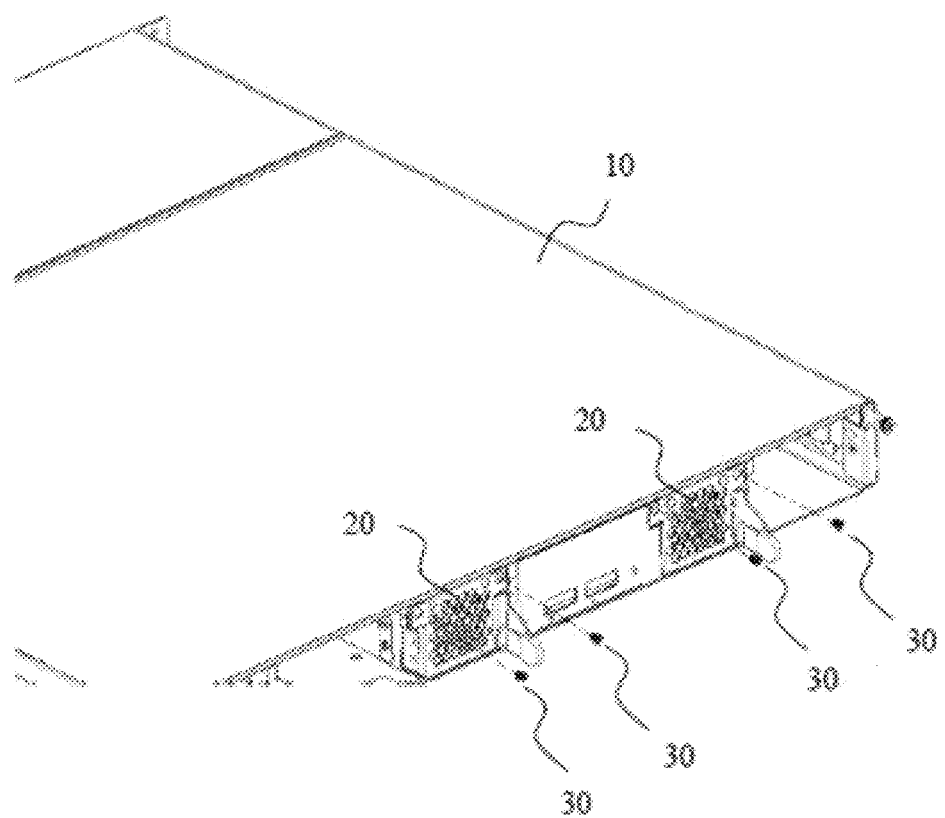
FIG. 1 is a schematic diagram illustrating a conventional manner for inserting or removing an apparatus.
Figure 2:
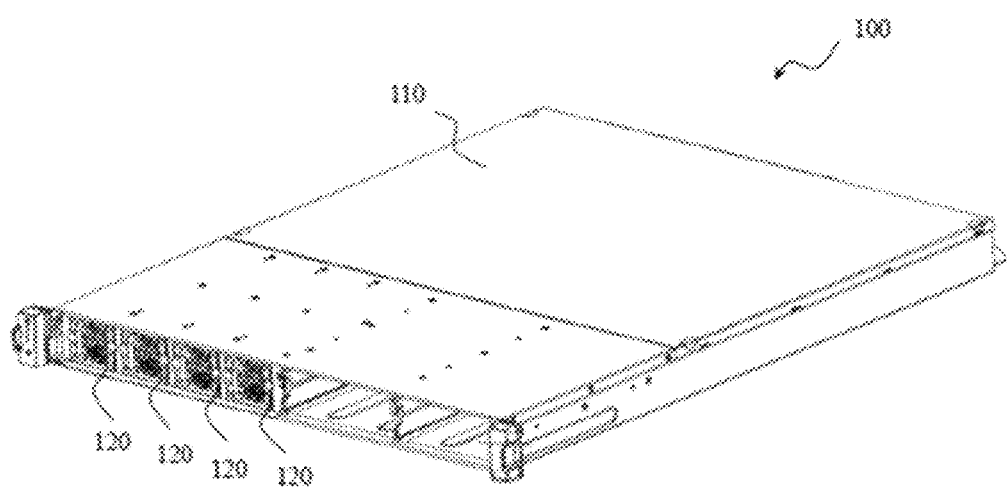
FIG. 2 is a front schematic diagram illustrating a system according to an embodiment of the present invention.
Figure 3:
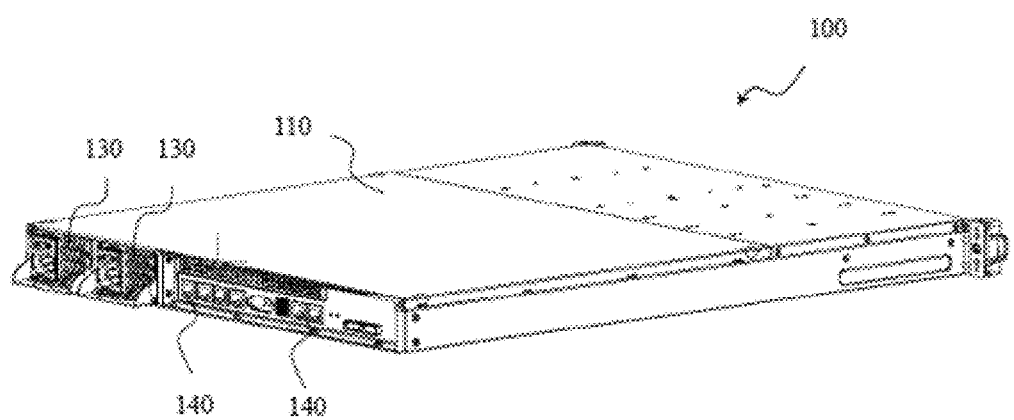
FIG. 3 is a rear schematic diagram of the system shown in FIG. 2.

Please refer to FIG. 2 and FIG. 3. FIG. 2 is a front schematic diagram illustrating a system 100 according to an embodiment of the present invention, and FIG. 3 is a rear schematic diagram of the system 100 shown in FIG. 2. According to the embodiment of the present invention, the system 100 can be a RAID controller, a Network Attached Storage (NAS), Personal Computer (PC), or other electronic equipments or electronic systems. As shown in FIG. 2, the system 100 comprises an enclosure 110, an apparatus 120 disposed within the enclosure 110, a power supply module 130 and a network interface device 140; wherein the system 100 can further comprise one or more hard disk(s)(not shown), a circuit board (not shown), a backplane (not shown). According to another embodiment of the present invention, the system 100 can be a non-electronic system, such as a storage cabinet system which has an enclosure and one or more removable/retractable storage box(es) contained within the enclosure.

According to the embodiment of the present invention, the enclosure 110 comprises a bottom plate, a top plate, and two side walls. According to the embodiment of the present invention, the apparatus 120 can be a fan module used for dissipating heat generated from the inside of enclosure 110 during operation of the system 100. According to another embodiment of the present invention, the apparatus 120 can be a power supply module, a battery module, a memory module, or the combinations thereof. According to another embodiment of the present invention, the apparatus 120 can be any devices, such as a box device for accommodating or a bracket device for mounting, which are capable of being removed from or being inserted into the enclosure 110.

More specifically, the hard disk(s) is(are) utilized for providing data storage space to the system 100, and the power supply module 130 is used for supplying power to the circuit board of the system 100. The hard disk(s) can be first mounted in a carrier (not shown), and then the carrier in which the hard disk is mounted, is inserted into the enclosure 110, or the hard disk(s) can be directly screwed into the enclosure 110. Furthermore, the backplane is disposed on the circuit board and has a plurality of connectors (not shown) thereon. When inserting the power supply module 130 or the apparatus 120 into the enclosure 110, connectors of the power supply module 130 or the apparatus 120 can be electrically connected with these connectors on the backplane so as to render the power supply module 130 provide the circuit board of the system 100 with the required power. According to an embodiment of the present invention, the circuit board can be a computer motherboard, a RAID controller board, or the circuit boards of computer peripheral equipments, or the combinations thereof. Additionally, the network interface device 140 is used for making the system 100 connected to external network.

Figure 4:
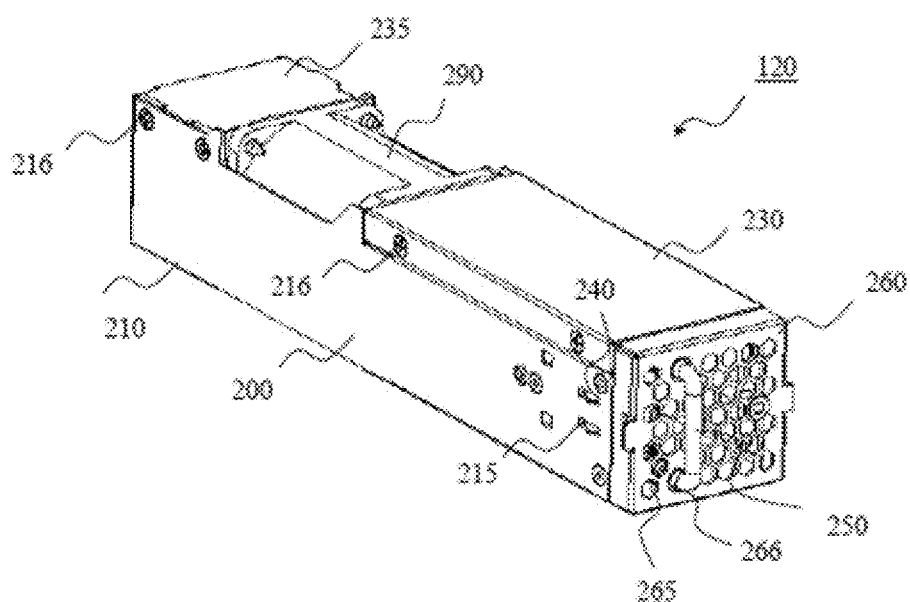
FIG. 4 is a schematic diagram showing the perspective view of an apparatus according to an embodiment of the present invention.
Figure 5:
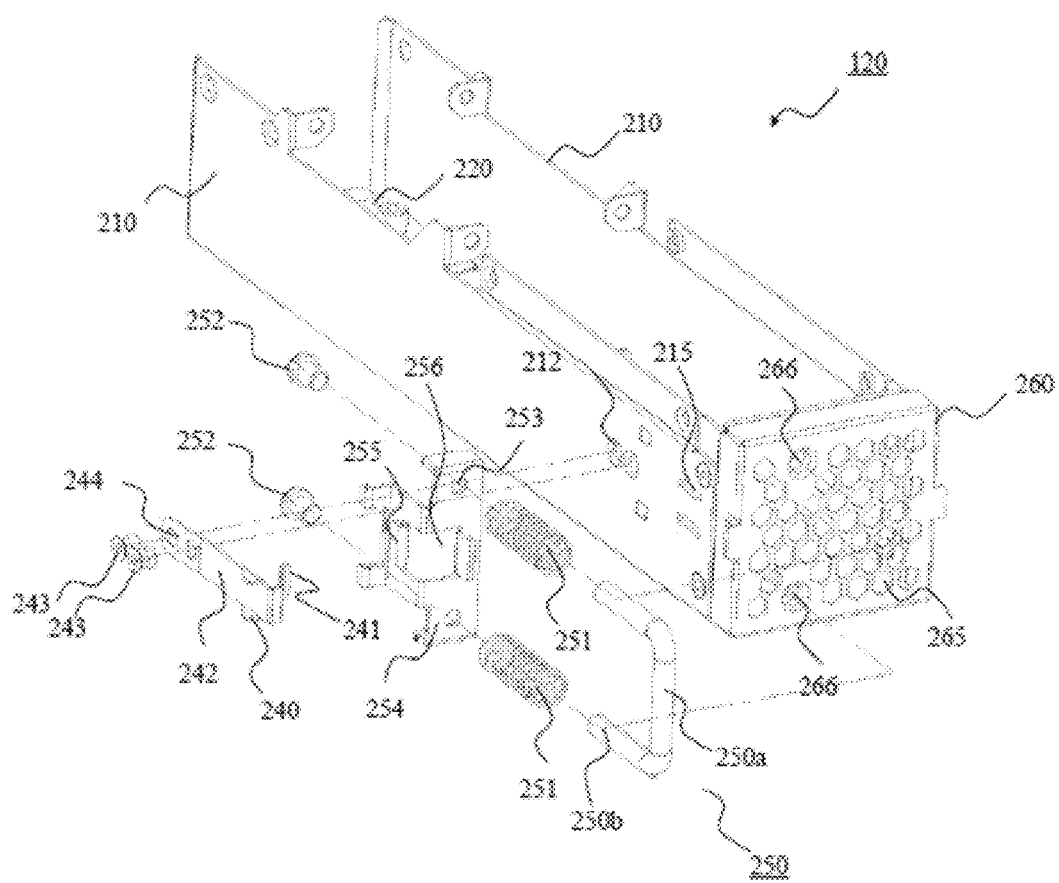
FIG. 5 is an exploded diagram of the apparatus shown in FIG. 4.

Please refer to FIG. 4 and FIG. 5. FIG. 4 is a schematic diagram showing the perspective view of the apparatus 120 according to the embodiment of the present invention, wherein the apparatus 120 is a fan module removed from the system 100. FIG. 5 is an exploded diagram of the apparatus 120, wherein the heat-dissipating fan 290, the front top plate 230, and the rear top plate 235 are omitted. The apparatus 120 can comprise a bracket 200, an extracting module 25, a driven module 24, and one or more heat-dissipating fan(s) 290 and a connector (not shown) disposed on the rear side of the apparatus 120. The heat-dissipating fan 290 can be a single fan or a serial fan set consisting of a plurality of fans. According to the embodiment of the present invention, the heat-dissipating fans 290 are disposed inside the apparatus 120 for dissipating the heat generated in the system 100, out of the enclosure 110. According to the embodiment of the present invention, the apparatus 120 can be any other devices in addition to the fan module, and meanwhile the apparatus 120 may comprise the bracket 200, the extracting module 25 and the driven module 24, but excludes the heat-dissipating fan 290.

According to the embodiment of the present invention, the bracket 200 is used for supporting the extracting module 25 and the driven module 24, and/or is used for supporting and mounting modules, parts, or objects in the apparatus 120. According to an embodiment of the present invention, the bracket 200 comprises one or more side wall(s) 210, a bottom plate 220, a front top plate 230, a rear top plate 235, and a front panel 260. According to an embodiment of the present invention, the side walls 210 and bottom plate 220 both can be one-piece unit (can be the side wall or the bottom plate) without using the screws 216. According to an embodiment of the present invention, the front top plate 230 and the rear top plate 235 can be one-piece top plate; moreover, according to an embodiment of the present invention, one of or both of the front top plate 230 and the rear top plate 235 can be omitted. According to another embodiment of the present invention, the bracket 200 can only comprise one or more of the plate(s), for example, comprising one or more of these plates selected from one or more side wall(s) 210, a bottom plate 220, a front top plate 230, a rear top plate 235, and a front panel 260) rather than comprising all these plates.

According to an embodiment of the present invention, the extracting module 25 comprises a handle 250, two springs 251, and an extracting piece 254, wherein the extracting piece 254 comprises one or more joining portion(s) 253 and a first contact portion 255. According to an embodiment of the present invention, the first contact portion 255 can be a cam member or an element that has an inclining plane. When user pulls the handle 250 out, the extracting module 25 is capable of allowing the first contact portion 255 to move toward right-hand side in response to the movement of the bracket 200, so as to apply force onto the driven module 24 and thus change the condition of the driven module 24. According to an embodiment of the present invention, the driven module 24 is disposed on the bracket 200 and comprises a driven piece 242. According to the embodiment of the present invention, the driven piece 242 further comprises one or more retaining portion(s) 244, a second contact portion 241, and one or more locking portion(s) 240. The driven module 24 is utilized for making the first contact portion 255 of the extracting module 25 apply a force onto the second contact portion 241 of the driven module 24, so as to change the condition of the driven module 24, so that the locking portion 240 moves from a locked position to an unlocked position, when the user pulls the handle 250 out.

According to an embodiment of the present invention, the release mechanism comprises the extracting module 25 and the driven module 24. According to an embodiment of the present invention, when the apparatus 120 is inserted into the enclosure 110, the connectors (not shown) on the apparatus 120 can be electrically connected to the connectors on the backplane (not shown).

According to an embodiment of the present invention, in the bracket 200, the side walls 210, the bottom plate 220, the front top plate 230, the rear top plate 235, and the front panel 260 are jointed one another, wherein there are a plurality of screw holes in the side walls 210, thus the screws 216 can be used to conjoin the front top plate 230 and the rear top plate 235 and the side walls 210 together through the screw holes.

Figure 6:
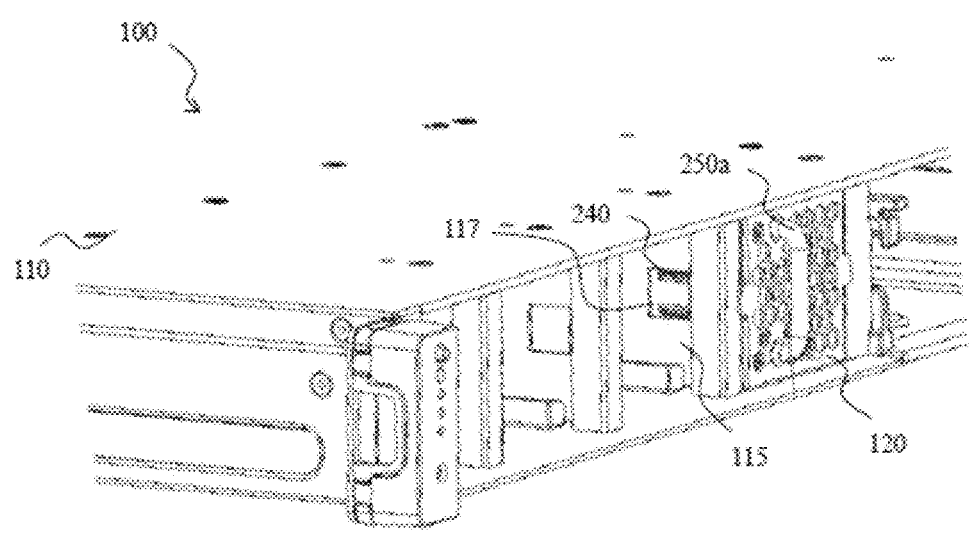
FIG. 6 is a schematic diagram illustrating the apparatus of FIG. 4, where the apparatus is fixed within an enclosure.

According to an embodiment of the present invention, the side walls 210 have one or more passage hole(s) 215 therein. Please refer to FIG. 6 and FIG. 7. When the apparatus 120 is inserted into the enclosure 110 to be under a locked position (i.e., the first condition shown in FIG. 7), because there is no force that is applied onto the driven module 24, the locking portions 240 of the driven piece 242 stretches out of the passage hole 215 to get stuck in the corresponding locking holes 117 (as shown in FIG. 6) in the enclosure 110, and thus the apparatus 120 is fixed within the enclosure 110.

According to an embodiment of the present invention, there are a plurality of heat-dissipating holes 265 in the front panel 260. When the heat-dissipating fans 290 works, the heat generated from the system 100 can be dissipated to the air through the plurality of heat-dissipating holes 265. According to an embodiment of the present invention, the front panel 260 has one or more handle hole(s) 266, through which the handle 250 passes, so as to conjoin with the extracting piece 254.

According to an embodiment of the present invention, the majority of the elongated portion 250b of the handle 250 is located within the front panel 260 when there is no force that is applied onto the handle 250.

When drawing the apparatus 120 out from the enclosure 110, the elongated portion 250b of the handle 250 passes through the handle hole 266 to stretch out of the front panel 260 due to the pulling force.

Please refer to FIG. 5 again, according to an embodiment of the present invention, the handle 250 comprises a holding portion 250a and at least one elongated portion 250b. When assembling the extracting module 25, the two ends of the elongated portion 250b pass through the two handle holes 266 of the front panel 260 respectively, which allows the holding portion 250a to be positioned on an outer side of the front panel 260, and allows the elongated portion 250b to be positioned on an inner side of the front panel 260. Inside the apparatus 120 (i.e., the inner side of the front panel 260), the two joining pieces 252 sequentially and respectively pass through the joining portions 253 of the extracting piece 254 and the springs 251 so as to conjoin with the two ends of the elongated portion 250b. According to an embodiment of the present invention, the joining piece 252 can be a screw, the joining portion 253 can be a screw hole, and the ends of the elongated portion 250b can have screw threads corresponding to the screws; however, it is not limited to this embodiment of the present of invention, the joining piece 252 can be other coupling devices capable of conjoining the joining portion 253 and the elongated portion 250b together. Moreover, the spring 251 is placed between the front panel 260 and the extracting piece 254. When there is no force that is applied onto the handle, majority of the elongated portion 250b of the handle 250 is located within the apparatus 120 due to the elastic force of the spring 251, and only the holding portion 250a is exposed on the outer side of the front panel 260. According to an embodiment of the present invention, the extracting piece 254 is an L-shaped sheet member having two surfaces, wherein there is a hole 256 at the intermediate connecting portion of the L-shaped sheet member, that is to say, the hole 256 is located in the two surfaces of the extracting piece 254; however, it is not limited to this embodiment of the present invention, the extracting piece 254 can be other shapes, and the hole can be omitted.

Please refer to FIG. 5 again, when assembling the driven module 24, the driven piece 242 is placed into the apparatus 120 (i.e., the inner side of the side wall 210), so that the locking portion 240 of the driven piece 242 penetrates through the passage hole 215 of the side wall 210 and protrudes out of the side wall 210, and then a retainer 243 is used to secure driven piece 242 onto the side wall 210 by penetrating through the hole 212 of the side wall 210 and the retaining portion 244 of the driven piece 242 sequentially. According to an embodiment of the present invention, the retainer 243 can be a rivet, and the retaining portion 244 can be a rivet hole. However, if the bracket 200 of the embodiment of the present invention does not have to have the side wall 210, then the locking portion 240 does not need to pass through the passage hole 215. According to an embodiment of the present invention, the driven piece 242 is a long sheet member with elasticity, and the retaining portion 244 of the driven piece 242 is flatted on the inner side of the side wall 210 and is fixed by the retainer 243. Furthermore, according to an embodiment of the present invention, the second contact portion 241 is a sheet-like elastic member, is conjoined to a plane of the driven piece 242 at an angle, and obliquely extends toward the inside of the apparatus 120. According to an embodiment of the present invention, the locking portion 240 of the driven piece 242 is a triangular-like sheet member, protrudes from the outer side of the driven piece 242 (the opposite side of the location of the second contact potion 241) and has a leading edge and a trailing edge. According to an embodiment of the present invention, the locking portion 240 is perpendicular to the side wall 210, and the retainer 243 can be a screw.

Please refer to FIG. 6 which shows that the apparatus is secured into the enclosure, When the apparatus 120 is under a locked position due to securing the apparatus 120 into the enclosure 110, the locking portion 240 of the driven piece 242 protrudes out of the locking hole 117 of the partition plate 115 of enclosure 110, and meanwhile, because the leading edge of the locking portion 240 abuts against the leading edge of the locking holes 117, the apparatus 120 cannot move forward in response to the enclosure 110 (toward the right hand side in the FIG. 6), so that the apparatus 120 can be secured within the enclosure 110, wherein the majority of the elongated portion 250b is located within the apparatus 120, and only the holding portion 250a is shown on the outer side of the front panel 260.

Please refer to FIG. 7 to FIG. 10, FIG. 7 to FIG. 10 are the top views illustrating the apparatus 120 of the present invention under the first, second, third, and fourth conditions respectively.

Figure 7:
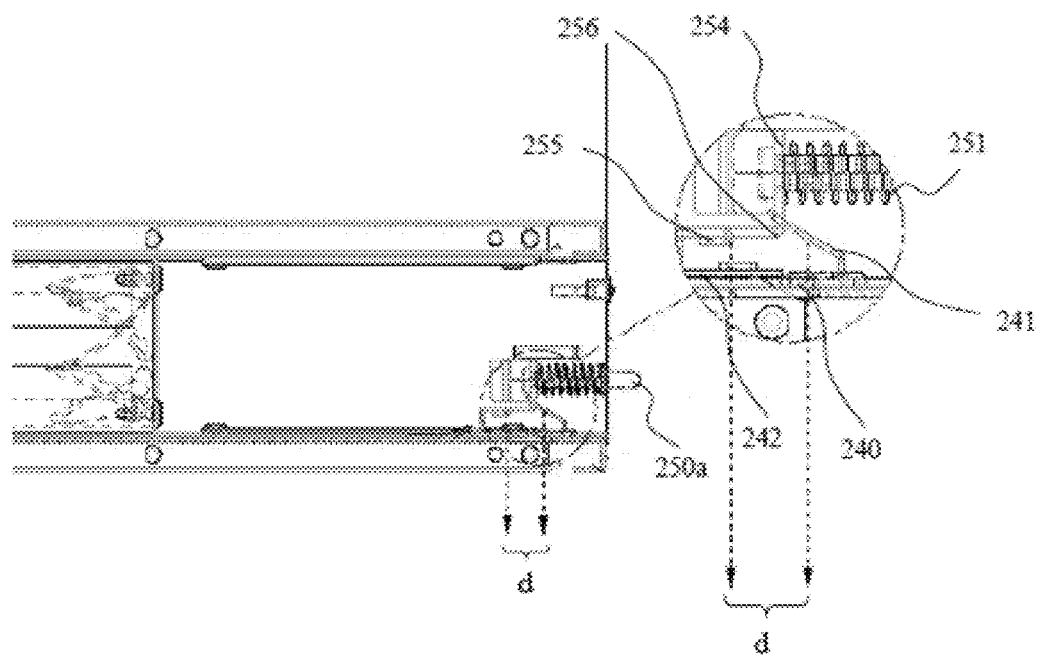
FIG. 7 is a top view of the apparatus under the first condition when in use according to an embodiment of the present invention.

FIG. 7 shows the top view illustration that the apparatus 120 is secured into the enclosure 110 (top of enclosure 110, front top plate 230 and rear top plate 235 are omitted) and is under the first condition. When the apparatus 120 is under the first condition, the locking portion 240 of the driven piece 242 may stretch out of the passage hole 215 to get stuck in the corresponding locking holes 117 of the partition plate 115, and further the locking portion 240 and the locking holes 117 abut against each other. And meanwhile, the end of the second contact portion 241 of the driven piece 242 protrudes into the hole 256 of the extracting piece 254, and the displacement stroke from the first contact portion 255 of the extracting piece 254 to the second contact portion 241 of the driven piece 242 is set to d.

Figure 8:
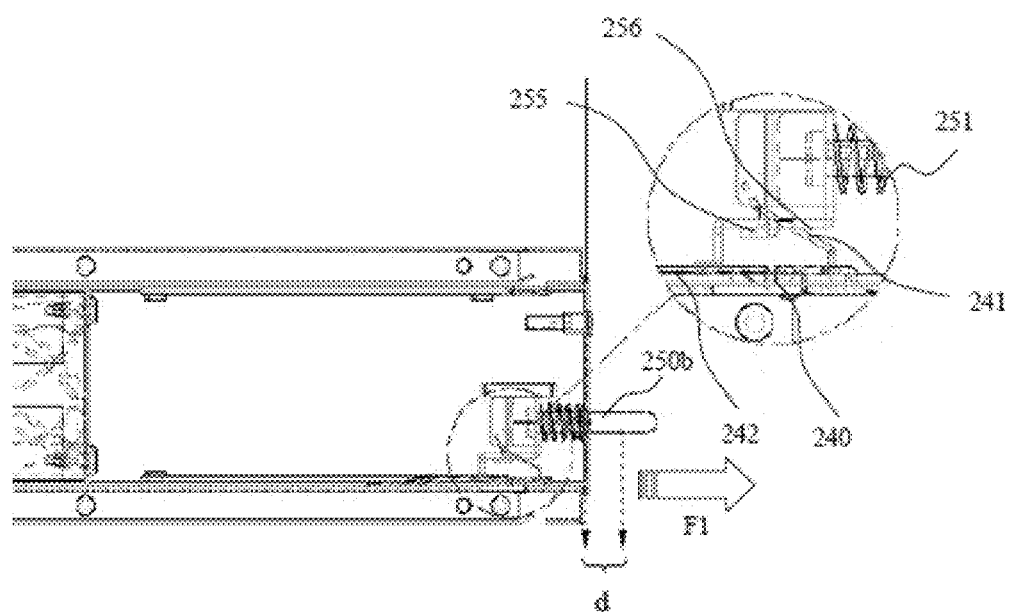
FIG. 8 is a top view of the apparatus of FIG. 7 under the second condition.

Please refer to FIG. 8 which shows the top view illustration that the handle 250 of apparatus 120 is applied with a pulling force F1 thereon (top of enclosure 110, front top plate 230 and rear top plate 235 are omitted), and it is under the second condition. As shown in FIG. 8, when the handle 250 is applied with a pulling force F1 thereon, and the handle 250 moves forward in response to the front panel 260, the extracting piece 254 and the hole 256 of the extracting piece 254 move forward, too, so that the end of the second contact portion 241 further protrudes into the hole 256 of the extracting piece 254; meanwhile, the first contact portion 255 of the extracting piece 254 moves forward in response to the driven piece 242 according to the displacement stroke d, which makes a distance between the second contact portion 241 of the driven piece 242 and the first contact portion 255 of the extracting piece 254, gradually decreased from d to zero (the distance equal to zero means that the first contact portion 255 gets contact with the second contact portion 241); moreover, the elongated portion 250b of the handle 250 gradually stretches out of the front panel 260. During the process that the distance between the first contact portion 255 and the second contact portion 241 is gradually decreased from d to zero, the length which the elongated portion 250b of the handle 250 stretch out of the front panel 260 is further increased by d, and the length of the spring 251 is also gradually decreased by d due to the pulling force. However, the corresponding position between the locking portion 240 and the locking holes 117 remains unchanged, and the locking portion 240 and the locking holes 117 remain to abut against each other, so that the apparatus 120 cannot move forward in response to the enclosure 110; therefore, the apparatus 120 is still locked within the enclosure 110. Accordingly, under the first condition, the design of the present invention can prevent the apparatus 120 from being turned into the unlocked position due to an unexpected force or due to a force applied by user's carelessness, even though there is a force that changes the apparatus 120 from the first condition into the second condition. It should be noted that the pulling force F1 is not a constant and may increase gradually as the handle 250 moves forward.

Figure 9:
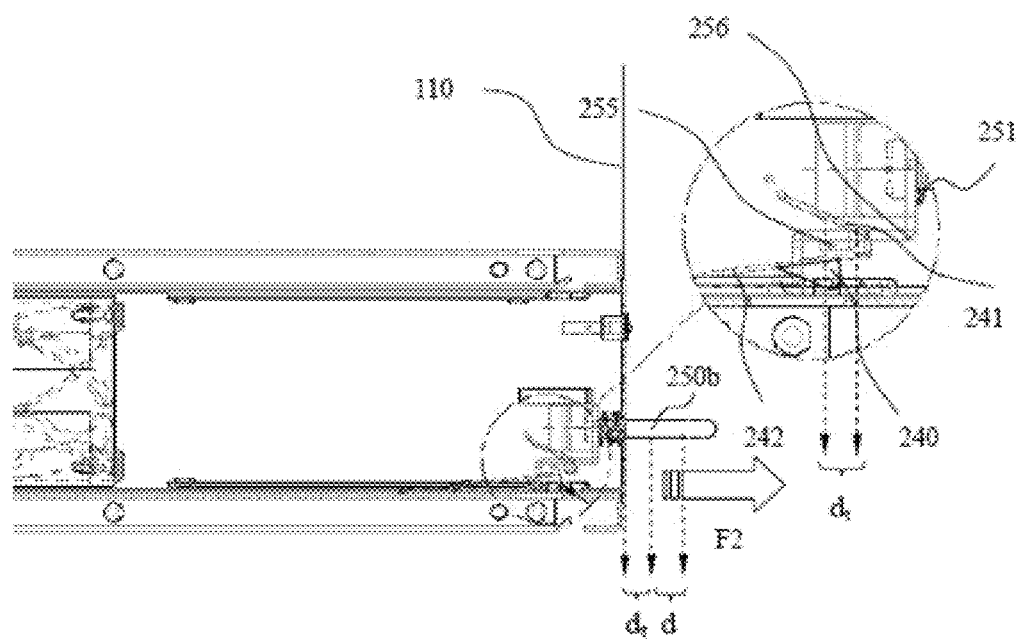
FIG. 9 is a top view of the apparatus of FIG. 7 under the third condition.

Please refer to FIG. 9. FIG. 9 shows the top view illustration that the handle 250 of apparatus 120 is applied with a pulling force F2 thereon (top of enclosure 110, front top plate 230 and rear top plate 235 are omitted), and it is under the third condition After the second condition, when the handle 250 is applied with another pulling force F2 which is larger than the pulling force F1, so as to render the handle 250 and the extracting piece 254 move forward in response to the front panel 260, the first contact portion 255 of the extracting piece 254 moves toward the front panel 260, abuts against an inclined plane of the second contact portion 241 of the driven piece 242, and pushes the second contact portion 241 forward. According to an embodiment of the present invention, the first contact portion and the second contact portion have at least one inclined plane, and the orientation of the inclined plane is not perpendicular to the moving direction of the handle. Because the retaining portion 244 of the driven piece 242 is fixed on the side wall 210 by the retainer 243 to form a fulcrum, and the driven piece 242 is an elastic member, the driven piece 242 gradually deforms inward due to the fulcrum achieved by the retaining portion 244. At this moment, the locking portion 240 of the driven piece 242 gradually makes a displacement, because the driven piece 242 gradually deforms inward, and then the locking portion 240 that originally protruded into the passage hole 215 of the side wall 210 may return back into the passage hole 215 gradually. At this moment, the corresponding position between the locking portion 240 and the locking hole 117 will be changed, and further the locking portion 240 and the locking hole 117 do not abut against each other any more, the apparatus 120 can be drawn out of the enclosure 110 due to an external force, which is the third condition at this moment. Under the third condition, the first contact portion 255 of the extracting piece 254 further moves by a distance dt, and the first contact portion 255 has a total displacement of d+dt including addition of the displacement d under the second condition, and the spring 251 is also compressed by length of d+dt. Before completing the third condition, the force F2 applied onto the handle 250 is larger than F1, because the spring 251 needs larger force to be compressed from the second condition where the spring 251 is compressed by d, to the third condition where the spring 251 is compressed by d+dt, and it also needs to supply an additional force to bend the driven piece 242 to overcome a friction that is generated between the first contact portion 255 and the second contact portion 241, and to overcome another friction generated between the locking portion 240 and the locking hole 117. Upon reaching the third condition, because the strength of F2 will be changed again due to disappearance of force which is caused by losing the contact between the locking portion 240 and the locking holes 117, and due to the change of the corresponding forces applied onto each of elements, F2 is also not a constant, and will be changed again. The F2 will be increased and is finally larger than F1 as the handle 250 moves forward from the second condition, and F2 is also changed according to the corresponding position among each of elements, and is changed again upon reaching the third condition.

Figure 10:
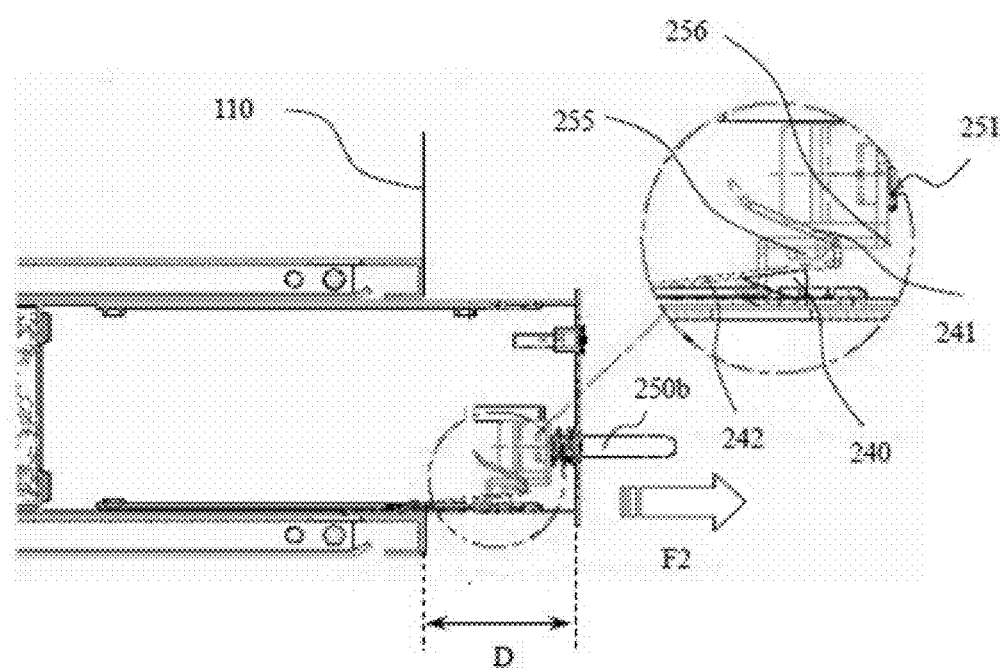
FIG. 10 is a top view of the apparatus of FIG. 7 under the fourth condition.

Please refer to FIG. 10. FIG. 10 shows the top view illustration that the handle 250 of apparatus 120 is applied with the pulling force F2 thereon (top of enclosure 110, front top plate 230 and rear top plate 235 are omitted), and then the fourth condition is reached. After reaching the third condition, because the locking portion 240 of the driven piece 242 and the locking hole 117 are separated and do not abut against each other any more, the apparatus 120 can be drawn from the enclosure 110. As shown in FIG. 10, the apparatus 120 is drawn from the enclosure 110 by a distance D.

In addition, while the apparatus 120 is drawn from the enclosure 110, and the force applied onto the handle 250 is disappeared, the elastic force generated by the spring 251 causes the extracting piece 254 to go back to its original position in a reverse direction, and the first contact portion 255 of the extracting piece 254 returns to its original position; furthermore, the driven piece 242 is also recovered to original condition, and the locking portion 240 of the driven piece 242 can stretch and protrude out of the passage hole 215 of the side wall 210 again at the same time, as shown in FIG. 4.

Figure 11:
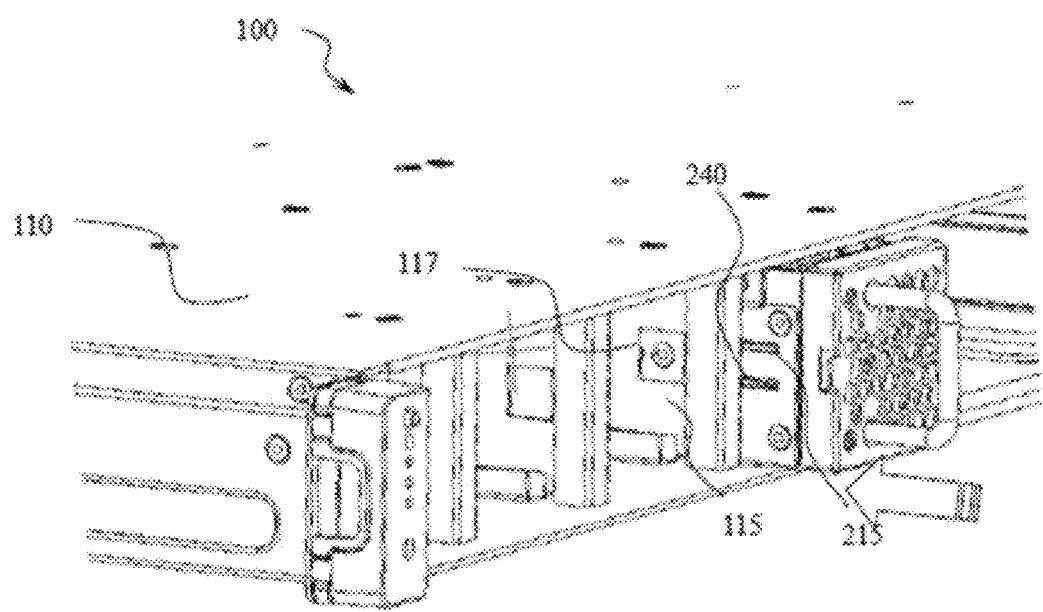
FIG. 11 is a schematic diagram illustrating that the apparatus shown in FIG. 4 is being inserted into the enclosure.

Please refer to FIG. 11. FIG. 11 shows a schematic diagram illustrating that the apparatus 120 applied by an external force thereon is being inserted back into the enclosure 110. As shown in FIG. 11, when the triangular-like locking portion 240 abuts against the partition plate 115 of enclosure 110, the oblique plane of the trailing edge of the locking portion 240 is pushed and temporarily returned back into the passage hole 215, and the driven piece 242 generates bending deformation due to the retraction of the locking portion 240. After completion of inserting the apparatus 120 into the enclosure 110, the locking portion 240 stretches out of the passage hole 215 and protrudes into the locking hole 117 of the partition plate 115 again, so that the locking portion 240 and the locking holes 117 abut against each other, and the apparatus 120 is secured within the enclosure 110.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. An apparatus with a handle having a release mechanism, comprising:
   a bracket having a front panel;
   an extracting module mounted on the bracket and comprising:
      an extracting piece having a first contact portion;
      a handle having a holding portion and at least one elongated portion, in which the holding portion is located in an outer side of the front panel, and the at least one elongated portion conjoins with the extracting piece; and
      a spring placed between the front panel and the extracting piece; and
   a driven module mounted on the bracket and having a driven piece, the driven piece including:
      a retaining portion fixed on the bracket;
      a locking portion; and
      a second contact portion;
   wherein when the apparatus is under a first condition, and the handle is not drawn forward, the locking portion of the driven piece is in a locked position, and when the handle is drawn forward so as to make the extracting piece move toward the front panel, and the first contact portion of the extracting piece drives the second contact portion of the driven piece, the apparatus is under a third condition, and the locking portion of the driven piece is moved to an unlocked position.

2. The apparatus of claim 1, wherein the bracket has a side wall including a passage hole, and when the apparatus is under the first condition, the locking portion of the driven piece stretches out of the passage hole.

3. The apparatus of claim 1, wherein the handle has two elongated portions which extend from the end of the holding portion respectively.

4. The apparatus of claim 1, wherein the spring is placed on the elongated portion of the handle.

5. The apparatus of claim 1, wherein the elongated portion penetrates through a handle hole of the front panel.

6. The apparatus of claim 1, wherein the extracting piece has a hole, into which at least part of the second contact portion of the driven piece is inserted.

7. The apparatus of claim 1, wherein the driven piece is elastic and generates deformation to make the locking portion of the driven piece move to the unlocked position, when the first contact portion of the extracting piece drives the second contact portion of the driven piece.

8. The apparatus of claim 1, wherein when the apparatus is under the first condition, and the handle is not drawn forward, the first contact portion of the extracting piece does not abut against the second contact portion of the driven piece, and when the handle is drawn forward to make the extracting piece move toward the front panel, the apparatus is under a second condition where the first contact portion of the extracting piece abuts against the second contact portion of the driven piece, but the locking portion of the driven piece is still in the locked position.

9. The apparatus of claim 1, wherein the handle is a U-shaped handle.

10. The apparatus of claim 1, wherein majority of the elongated portion of the handle is located within the front panel when there is no any force applied thereon.

11. The apparatus of claim 1, wherein the first contact portion and the second contact portion have at least one inclined plane, and the orientation of the inclined plane is not perpendicular to the moving direction of the handle.

12. The apparatus of claim 1, wherein the locking portion has a leading edge which is perpendicular to the moving direction of the handle.

13. The apparatus of claim 1, wherein the locking portion has a trailing edge which is not perpendicular to the moving direction of the handle.

14. The apparatus of claim 1, wherein the retaining portion of the driven piece is riveted onto the bracket through a rivet.

15. The apparatus of claim 1, wherein the bracket has a side wall including a passage hole, and when the apparatus is under the third condition, majority of the locking portion of the driven piece returns back into the passage hole.

16. The apparatus of claim 1, wherein the apparatus is a fan module.

17. The apparatus of claim 1, wherein the apparatus is one of a power supply module, a battery module, and a memory module.

18. A system containing an apparatus with a handle, comprising:
    an enclosure;
    an apparatus detachably disposed within the enclosure and comprising a bracket, an extracting module, and a driven module;
    the extracting module placed on the bracket and comprising:
        an extracting piece having a first contact portion;
        a handle conjoined with the extracting piece; and
        a spring placed between a front panel of the bracket and the extracting piece; and
    the driven module secured on the bracket and having a driven piece, the driven piece including a locking portion and a second contact portion;
    wherein when the apparatus is under a first condition, and the handle is not drawn forward, the locking portion of the driven piece is in a locked position, so that the apparatus is not drawn from the enclosure, and when the handle is drawn forward so as to make the extracting piece move toward the front panel, and the first contact portion of the extracting piece drives the second contact portion of the driven piece, the apparatus is under a third condition, and the locking portion of the driven piece is moved to an unlocked position, so that the apparatus is drawn from the enclosure.

19. The system of claim 18, wherein the bracket has a side wall including a passage hole, and when the apparatus is under the first condition, the locking portion of the driven piece stretches out of the passage hole, reaches into a locking hole of the system and is located in the locked position, so that the apparatus is not drawn from the enclosure.

20. The system of claim 18, wherein the handle has two elongated portions which extend from the end of the holding portion respectively, and the spring is placed on the elongated portion of the handle.

21. The system of claim 18, wherein the elongated portion of the handle penetrates through the front panel.

22. The system of claim 18, wherein the driven piece has a retaining portion used to fix the driven piece on the bracket.

23. The system of claim 18, wherein the driven piece is elastic and generates deformation to make the locking portion of the driven piece move to the unlocked position and causes the apparatus to be drawn from the enclosure, when the first contact portion of the extracting piece drives the second contact portion of the driven piece.

24. The system of claim 18, wherein when the apparatus is under the first condition, and the handle is not drawn forward, the first contact portion of the extracting piece does not abut against the second contact portion of the driven piece, and when the handle is drawn forward to make the extracting piece move toward the front panel, the apparatus is under a second condition where the first contact portion of the extracting piece abuts against the second contact portion of the driven piece, but the locking portion of the driven piece is still in the locked position.

25. The system of claim 18, wherein the first contact portion and the second contact portion have at least one inclined plane, and the orientation of the inclined plane is not perpendicular to the moving direction of the handle.

26. The system of claim 18, wherein the locking portion has a leading edge which is perpendicular to the moving direction of the handle.

27. The system of claim 18, wherein the locking portion has a trailing edge which is not perpendicular to the moving direction of the handle.

28. The system of claim 18, wherein the bracket has a side wall including a passage hole, and when the apparatus is under the third condition, majority of the locking portion of the driven piece returns back into the passage hole to be moved to the unlocked position, so that the apparatus is drawn from the enclosure.

29. The system of claim 18, wherein the apparatus is a fan module.

30. The system of claim 18, wherein the apparatus is one of a power supply module, a battery module, and a memory module.

* * * * *